United States Patent
Ban et al.

(10) Patent No.: US 8,374,470 B2
(45) Date of Patent: Feb. 12, 2013

(54) STRUCTURE COMPRISING OPTO-ELECTRIC HYBRID BOARD AND OPTO-ELECTRIC PACKAGE

(75) Inventors: Takuma Ban, Kamakura (JP); Yasunobu Matsuoka, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 403 days.

(21) Appl. No.: 12/559,637

(22) Filed: Sep. 15, 2009

(65) Prior Publication Data
US 2010/0054671 A1 Mar. 4, 2010

(51) Int. Cl.
G02B 6/30 (2006.01)
G02B 6/32 (2006.01)

(52) U.S. Cl. .......................... 385/49; 385/34
(58) Field of Classification Search .............. 385/49, 385/34
See application file for complete search history.

(56) References Cited

U.S. PATENT DOCUMENTS

| | | | |
|---|---|---|---|
| 5,621,837 A * | 4/1997 | Yamada et al. | 385/88 |
| 6,027,254 A * | 2/2000 | Yamada et al. | 385/88 |
| 6,164,836 A * | 12/2000 | Yamada et al. | 385/88 |
| 6,477,286 B1 * | 11/2002 | Ouchi | 385/14 |
| 7,230,278 B2 * | 6/2007 | Yamada et al. | 257/80 |
| 7,271,461 B2 * | 9/2007 | Dutta | 257/432 |
| 7,312,520 B2 * | 12/2007 | Furuyama et al. | 257/688 |
| 7,427,804 B2 * | 9/2008 | Yamada et al. | 257/678 |
| 7,851,811 B2 * | 12/2010 | Dutta | 257/84 |
| 2004/0184737 A1 | 9/2004 | Oono et al. | |
| 2004/0218372 A1 * | 11/2004 | Hamasaki et al. | 361/767 |
| 2005/0018977 A1 * | 1/2005 | Beer et al. | 385/88 |
| 2005/0087747 A1 * | 4/2005 | Yamada et al. | 257/80 |
| 2006/0120666 A1 * | 6/2006 | Ohtorii | 385/33 |
| 2006/0192278 A1 * | 8/2006 | Furuyama et al. | 257/686 |

FOREIGN PATENT DOCUMENTS

| | | |
|---|---|---|
| JP | 2001-185752 A | 7/2001 |
| JP | 2002-353388 A | 6/2002 |
| JP | 2004-286835 A | 10/2004 |
| JP | 2005-37869 A | 2/2005 |
| JP | 2005-84165 A | 3/2005 |
| JP | 2005-301114 A | 10/2005 |
| JP | 2006-258835 A | 9/2006 |
| JP | 2007-067288 A | 3/2007 |

* cited by examiner

*Primary Examiner* — K. Cyrus Kianni
(74) *Attorney, Agent, or Firm* — Mattingly & Malur, PC (57) ABSTRACT

A structure which stably achieves electrical coupling, and is capable of efficient optical coupling is provided. Optical coupling is achieved with the lower surface of an opto-electric package and the upper surface of an opto-electric hybrid board. On the other hand, electrical connection is achieved by means of contact between electrodes on the side surfaces of the opto-electric package and electrodes on the inner-wall side surfaces of a socket mounted on the opto-electric hybrid board. The electrodes are in electrical contact with electrical wiring.

7 Claims, 8 Drawing Sheets

STRUCTURE COMPRISING OPTO-ELECTRIC HYBRID BOARD AND OPTO-ELECTRIC PACKAGE

BACKGROUND OF THE INVENTION

1. Field of the Invention

The present invention relates to a semiconductor device that is used by utilizing optical communications technology and to an optical signal input/output device using same, and more particularly to a semiconductor device that enables the processing of multiple optical signals and to an optical signal input/output device using same.

2. Background Art

In recent years, with the rapid proliferation of the Internet and the like, the capacity for information processing handled by transmission devices such as routers, servers, switches and the like, storage devices, and the like is increasing rapidly. Currently, boards with electrical wiring, electronic components mounted on such boards, and electrical transmission lines interconnecting the electronic components are packaged in such devices. In other words, most of the data that is inputted from outside the devices are processed as electrical signals within the devices. However, the amount and speed of information processing handled per device is growing year by year, and limits are occurring for the electrical interconnects within devices for the following reasons:

(1) high frequency noise occurs as speed increases. Device malfunctions increase due to this increase in noise;
(2) electrical loss in the electrical transmission lines on the board becomes greater at high frequencies, thereby placing a limit on how fast electrical signals can be made to be; and
(3) as electricity reaches high frequencies, crosstalk occurs among the electrical wiring, and malfunctions occur in devices.

In recent years, in order to resolve the above-mentioned shortcomings of electrical interconnects, devices in which electronic components are interconnected with optical signals have started to become the subject of research and development. Since light is non-inductive, it has an advantage which is that noise, loss, and crosstalk do not occur even when the transmission speed of optical signals is increased. In a conventional optical signal input/output device in which information transmission between electronic components is carried out by means of optical signals, a surface-type optical device array is mounted on an LSI chip, and the surface-type optical device array and a multilayer optical waveguide portion on a printed board are optically coupled as disclosed in, for example, JP Patent Publication (Kokai) No. 2001-185752 A. Electrode pads on the printed board and an electrical wiring layer of the LSI chip are bonded by means of solder bumps, and through these solder bumps, power is supplied and control signals are sent from the printed board to the LSI chip and the surface-type optical devices. The exchange of signals using a TBGA (Tape Ball Grid Array) package structure is as follows. Input optical signals travel through a multilayer optical waveguide portion formed on a printed board, and are inputted to a surface-type optical device array having a light-receiving function. The inputted optical signals are converted into electrical signals by the surface-type optical device array, and are inputted to an LSI chip. Conversely, the electrical signals outputted by the LSI chip are converted into optical signals at surface-type optical devices having a light emitting function, and are then inputted to the multilayer optical waveguide portion. In general, it is difficult to form vias and through-holes for electrical conduction in a multilayer optical waveguide portion. Therefore, it has been conventional to provide electrode pads on a printed board and to not form multilayer optical waveguides on the upper surface of the electrode pads.

[Patent Document 1] JP Patent Publication (Kokai) No. 2001-185752 A

SUMMARY OF THE INVENTION

However, the following problems are present in conventional techniques. Firstly, for solder bumps for fixing a TBGA package structure on a printed board, those that are melted from solder balls with diameters of approximately 500 microns to 1000 microns are generally used. It is generally difficult to control the shapes of these solder bumps, and there arise errors in the heights of the solder bumps on the order of several hundred microns depending on the product. On the other hand, a multilayer optical waveguide portion comprises a core portion and a cladding portion surrounding the core portion, and each waveguide layer has a thickness of approximately 100 microns to 200 microns. In general, thickness control for the core portion through which light is guided must be carried out with precision on the order of several microns, whereas thickness control for the cladding portion, from a manufacturing cost perspective, is on the order of several tens of microns per layer. Therefore, as the number of layers of waveguides increases, the thickness error of the multilayer optical waveguide portion increases. In addition, the multilayer optical waveguide portion needs to be adhered to the printed board by means of an adhesive or the like. The thickness of this adhesion layer is determined by the thermal expansion coefficients, wettability, and the like of the multilayer optical waveguide portion and the printed board, and in some instances a thickness on the order of several hundred microns is required. Controlling this adhesion layer thickness is generally difficult, and thickness errors on the order of several tens to hundreds of microns occur.

Thus, in conventional optical signal input/output devices, there is a problem in that the distance between a surface-type optical device and a multilayer optical waveguide portion is offset from the optimum distance by approximately several hundred microns in some instances due to thickness errors in the solder bumps, the multilayer optical waveguide portion, and the adhesion layer, thereby causing degradation in the optical coupling efficiency. In particular, when the distance is farther apart than the optimum position, degradation in the optical coupling is generally severe, and requires improvement.

The object of the present invention is to provide, with respect to a structure comprising an opto-electric package capable of inputting (outputting) electrical signals and of inputting (outputting) optical signals and a printed board (opto-electric hybrid board) in which an optical waveguide is formed, a structure in which electrical coupling can be achieved stably and in which efficient optical coupling is possible.

The opto-electric hybrid board is provided with an optical waveguide that transmits optical signals and an electrical transmission line that supplies power. The opto-electric package comprises a light receiving device and a light emitting device for transmitting/receiving optical signals to/from the optical waveguide of the opto-electric hybrid board. In the present invention, optical coupling between the opto-electric hybrid board and the opto-electric package is achieved between the lower surface of the opto-electric package and the upper surface of the opto-electric hybrid board. In addition, electrical coupling between the opto-electric hybrid board and the opto-electric package is achieved in a plane that is perpendicular to the surface of the opto-electric hybrid board. Therefore, electrodes are provided on the side surfaces of the opto-electric package, and a first member, in which second electrodes that contact the first electrodes are provided on inner-wall side surfaces of the first member that face the side surfaces of the opto-electric package, are used. The second electrodes of the first member are connected to the electrical transmission line of the opto-electric hybrid board. The first member may be provided as a socket that is separate from the opto-electric hybrid board and that has a through-hole into which the opto-electric package is to be inserted, or as a recessed portion provided in the opto-electric hybrid board and into which the opto-electric package is to be inserted.

According to the present invention, with respect to a structure comprising an opto-electric package capable of inputting (and/or outputting) electrical signals and of inputting (and/or outputting) optical signals and an opto-electric hybrid board in which an optical waveguide is formed, it is possible to provide a structure in which electrical coupling can be achieved stably and in which efficient optical coupling is possible.

BRIEF DESCRIPTION OF THE DRAWINGS

FIGS. 1A and 1B are diagrams showing a structure of the first embodiment of the present invention where

FIGS. 5A and 5B are diagrams showing a structure of the fourth embodiment of the present invention where

FIGS. 6A and 6B are diagrams showing a structure of the fifth embodiment of the present invention where

FIGS. 7A and 7B are diagrams showing a structure of the sixth embodiment of the present invention where

DETAILED DESCRIPTION OF THE PREFERRED EMBODIMENTS

On an opto-electric hybrid board, there is formed an electrical transmission line for inputting/outputting power, as well as an optical waveguide equipped with a mechanism for inputting/outputting optical signals in a direction that is perpendicular to the opto-electric hybrid board. At a portion of the optical waveguide, there is provided a mechanism for inputting optical signals and for outputting optical signals from the optical waveguide. In addition, part of that mechanism is formed by providing a 45° mirror surface and the like in the optical waveguide. The opto-electric package comprises a light receiving device for receiving an optical signal outputted from the optical waveguide formed on the opto-electric hybrid board and converting it into an electrical signal and/or a light emitting device for converting an electrical signal into an optical signal. An optical signal input/output portion of the opto-electric hybrid board is located on the upper surface thereof, and an optical signal input/output portion of the opto-electric package is located on the lower surface thereof. In addition, besides optical devices, ICs and electronic components are mounted on the opto-electric package as required. First electrodes for inputting/outputting power are provided on the side surfaces of the opto-electric package.

Second electrodes that are in contact conduction with the first electrodes are attached to a first member. The first member may be integral with the opto-electric hybrid board, or it may be a separate member mounted on the opto-electric hybrid board. Conduction is achieved between the second electrodes and the electrical transmission line of the opto-electric hybrid board by means of electrical wiring, and the intermediate path of this electrical wiring may take on any form, such as patterned lines, through-holes, vias, solder, connectors, and the like, as long as electrical conduction can be achieved.

With the structure above, it is possible to freely bring the opto-electric package into close proximity with the optical waveguide while maintaining the electrical coupling with the opto-electric hybrid board, and the opto-electric package becomes able to realize highly efficient optical coupling.

The first member may be provided as a socket provided on the opto-electric hybrid board. The socket comprises a through-hole, and the opto-electric package is inserted into this through hole. The second electrodes are formed on the inner-wall side surfaces of the through-hole. Thus, by inserting the opto-electric package into the through-hole in the socket, contact conduction is achieved between the first electrodes and the second electrodes. Electrical wiring is formed on the side surfaces or the interior of the socket, thereby achieving conduction between the second electrodes and the electrical transmission line on the opto-electric hybrid board. The socket is fixed to a part of the electrical transmission line on the opto-electric hybrid board by means of a PGA (Pin Grid Array) or solder bumps, thereby achieving an electrical connection. With the structure above, it is possible to provide a socket on the upper surface of the opto-electric hybrid board, and it becomes possible to stably achieve electrical coupling and optical coupling.

The side surfaces of the opto-electric package generally comprise four surfaces. However, by providing stair-like level differences, the side surfaces of the opto-electric package would count more than four surfaces. The first electrodes may be provided on each of these surfaces as desired. The number of the second electrodes can similarly be increased by similarly arranging the surfaces of the first member facing the side surfaces of the opto-electric package in a stair-like fashion. It thus becomes possible to increase the number of pins for the power inputted to the opto-electric package or for the power outputted from the opto-electric package.

A mechanism that mates with a guide pin may be provided on the opto-electric package and the opto-electric hybrid board. The guide pin mating mechanism may be formed by providing holes or grooves in the opto-electric package or the opto-electric hybrid board, or it may be formed by mounting a member comprising holes or grooves onto the opto-electric package or the opto-electric hybrid board. With the structure above, it becomes possible to improve the precision of the optical coupling between the opto-electric package and the opto-electric hybrid board.

At least part of the first electrodes or the second electrodes may be configured with a resilient conductor, in which case there is an advantage which is that, even if the manufacturing precision of the opto-electric package and the manufacturing precision or mounting precision of the first member holding the second electrodes were to vary, electrical conduction between the first electrodes and the second electrodes would be maintained.

In particular, the effect is greater when the configuration in which the electrode is provided as a resilient body is combined with the configuration in which a guide pin is used. In fabricating the opto-electric package and the opto-electric hybrid board, the relative positions of the optical input/output portion and the electrodes are generally offset. When optical coupling, which requires precision, is positioned by means of a guide pin, there arises an offset between the first electrodes and the second electrodes. However, by using resilient conductors for the electrodes, there is an advantage which is that conduction can be achieved even if a positional offset occurs.

One or a plurality of second members may be disposed between the lower surface of the opto-electric package and the optical waveguide, and the gap between the opto-electric package and the optical waveguide may be determined by at least one of these second members. Consequently, there would be an advantage which is that the optical waveguide can be prevented from coming into direct contact with members that are susceptible to impact or pressure such as, for example, micro optical members, optical devices, ICs and the like if such members were to be mounted on the lower surface of the opto-electric package.

It is possible to mate guide pins and the like with the second member that determines the gap between the opto-electric package and the optical waveguide. Consequently, it is possible to achieve positioning between the opto-electric package and the optical waveguide not only in the height direction but also in the left-right direction as well. By surrounding, with the second member, the area through which optical signals travel, it is possible to prevent external dirt, dust, and the like from entering the portion through which optical signals propagate.

When a lens element is inserted into at least part of an optical signal propagation channel between the opto-electric package and the optical waveguide, the optical coupling efficiency between the opto-electric package and the optical waveguide improves. By providing, in a lens member to which the lens element is attached, a hole or groove for mating with the guide pin, the positioning of the lens member in the left-right direction becomes easier. By surrounding the periphery of the optical signal optical axis between the opto-electric package and the optical waveguide with the lens member or with the lens member and a third member, it is possible to prevent external dirt, dust, and the like from entering the portion through which optical signals propagate.

The optical waveguide may be formed on at least a part of the opto-electric hybrid board. Optical waveguides are generally made of organic materials such as polymers, and it is difficult to form vias, through-holes, and the like for electrical conduction. As such, by disposing the optical waveguide in such a manner that the optical waveguide does not cover the entire upper surface of the opto-electric hybrid board and such that at least part of the electrodes on the opto-electric hybrid board is exposed, it is possible to readily achieve optical and electrical coupling between the opto-electric hybrid board and the opto-electric package.

Contact conduction between electrodes provided on the lower surface of a socket and electrodes on an opto-electric hybrid board is generally achieved by means of solder bumps, PGA (Pin Grid Array), and the like. By providing a notch portion on the lower surface of the socket so that no part of the socket would come into contact with the optical waveguide, the optical waveguide formed on the opto-electric hybrid board is prevented from being damaged.

At least part of the optical waveguide may be provided at an inner layer of the opto-electric hybrid board, in which case the portion of the opto-electric hybrid board to/from which optical signals are inputted/outputted is a recessed portion, and part of the optical waveguide is either exposed or covered with a transparent member thereat. With this structure, because the area across which the optical waveguide is exposed is reduced, the space on the opto-electric hybrid board on which electrodes may be provided becomes greater.

At least part of the optical waveguide may also be disposed at the lower layer of the opto-electric hybrid board. The opto-electric package is mounted from above. Therefore, the portion of the opto-electric hybrid board to/from which optical signals are inputted/outputted is a recessed portion, and part of the optical waveguide is either exposed or covered with a transparent member thereat. With this structure, besides the advantage that the space on the upper surface of the opto-electric hybrid board on which electrodes may be provided becomes greater, there is also an advantage which is that inner layer electrical wiring can also be performed with ease since no optical waveguide is provided within the opto-electric hybrid board.

In structures in which at least part of an optical waveguide is located at the lower layer of an opto-electric hybrid board and in which an opto-electric package is mounted from above the opto-electric hybrid board, the optical waveguide, which is made of organic materials such as polymers and the like, is generally often very flexible. Thus, there is a problem which is that when the opto-electric package is mounted over the optical waveguide, the optical waveguide experiences strain and the like, and optical propagation performance thus drops. As such, by attaching a fourth member to the optical waveguide from below, it becomes possible to prevent the strain and the like experienced by the optical waveguide which causes optical propagation degradation.

When the opto-electric package is pressed and fixed towards the opto-electric hybrid board side from above, the optical path length of the opto-electric package and the optical waveguide is stably fixed at the shortest distance, and the optical coupling efficiency stabilizes. The mechanism for pressing and fixing the opto-electric package may be fixed to the opto-electric hybrid board or it may also be fixed to a part of any given member mounted on the opto-electric hybrid board.

Besides optical devices, sometimes members that produce heat, such as ICs, electronic components, and the like, are mounted on the opto-electric package. As such, a heat dissipating member may be provided on the mechanism for pressing and fixing the opto-electric package, and the heat dissipating member may be pressed against the opto-electric package or the components mounted on the opto-electric package. Thus, not only is the opto-electric package stably fixed, but heat dissipating efficiency can also be enhanced.

Hereinafter, the present invention will be described more specifically by way of embodiments.

Embodiment 1

Figure 1A:
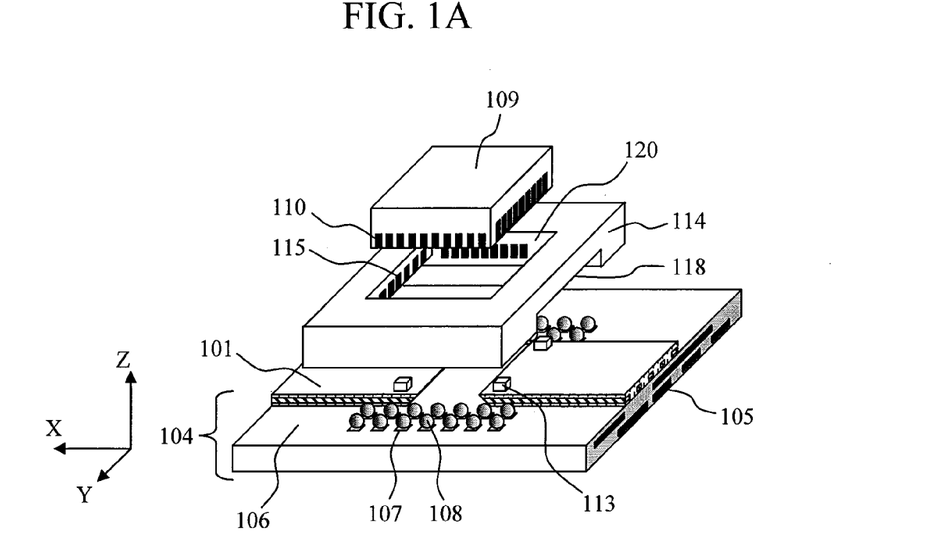
FIG. 1A is a perspective view and FIG. 1B is a sectional view.
Figure 1B:
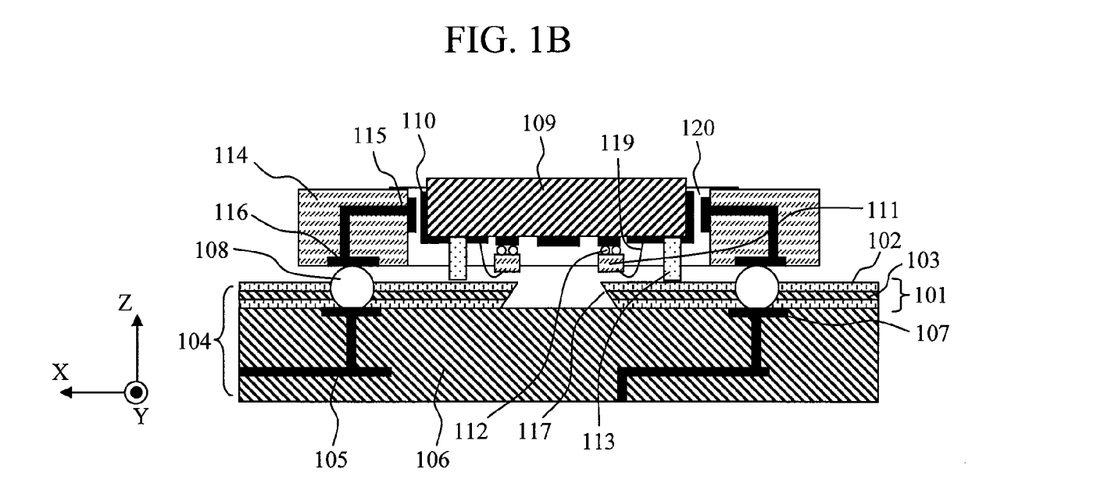

FIG. 1A is a perspective view showing a mounting example of an opto-electric package 109 and an opto-electric hybrid board 104 as embodiment 1 of the present invention. FIG. 1B shows a sectional view in which the opto-electric package 109 of FIG. 1A is mounted on the opto-electric hybrid board 104 and is cut along the XZ plane. In actual use, other electronic components and the like besides the opto-electric package 109 are mounted on the opto-electric hybrid board 104.

Optical waveguides 101 are formed on the opto-electric hybrid board 104. The optical waveguides 101 comprise a core portion 103 and a cladding portion 102. In addition, a mirror portion 117 is provided at a location where optical signals are inputted/outputted, which is generally made in such a manner that optical signals are inputted/outputted in the direction of the Z-axis. The optical waveguides 101 are often adhered onto a printed board 106 by means of an adhesive or the like.

Electrodes 107 are provided on the opto-electric hybrid board 104, thereby allowing the inputting/outputting of power. An organic material such as a translucent polymer or the like is used for the optical waveguides 101, and it is generally difficult to perform electrical through-hole and via processes. Therefore, the optical waveguides 101 are so disposed as not to overlap the electrodes 107.

A socket 114 comprising a through-hole is mounted and fixed on the opto-electric hybrid board 104. Electrodes 115 are provided on the inner-wall side surfaces 120 of the through-hole of the socket 114. Here, electrodes 116 of the socket 114 and the electrodes 107 of the opto-electric hybrid board 104 are bonded by means of solder bumps 108 and electrical wiring is identified by numeral 105. The electrodes 116 are in electrical contact with the electrodes 115 formed on the same socket 114. A notch portion 118 is provided on the lower side of the socket 114 so that the socket 114 and the optical waveguides 101 do not contact one another. This is because when the optical waveguides 101 come into contact with another member, the optical waveguides 101 may bend, possibly resulting in optical propagation performance degradation.

Optical devices 111 are mounted on the electrodes on the lower surface of the opto-electric package 109 by means of solder bumps 112. Besides the optical devices 111, such electronic components as ICs, condensers, capacitors, resistors, and the like may be mounted on the opto-electric package 109. Electrodes 110 are located on the side surfaces of the opto-electric package 109. Thus, by inserting the opto-electric package 109 into the through-hole provided in the socket 114, electrical conduction between the electrodes 110 and the electrodes 115 becomes possible. As long as the electrodes 110 and the electrodes 115 are in contact, the position of the opto-electric package 109 in the Z-axis direction may be changed freely. In particular, in order to enhance the optical coupling efficiency between the optical devices 111 and the optical waveguides 101, the optical devices 111 and the optical waveguides 101 should be placed in close proximity. If power is supplied to the optical devices 111 by means of wires 119, the wires 119 may be prevented from coming into contact with the optical waveguides 101 by providing pedestals 113 on the optical waveguides 101 and thus determining the position of the opto-electric package 109 in the Z direction.

Embodiment 2

Figure 2:
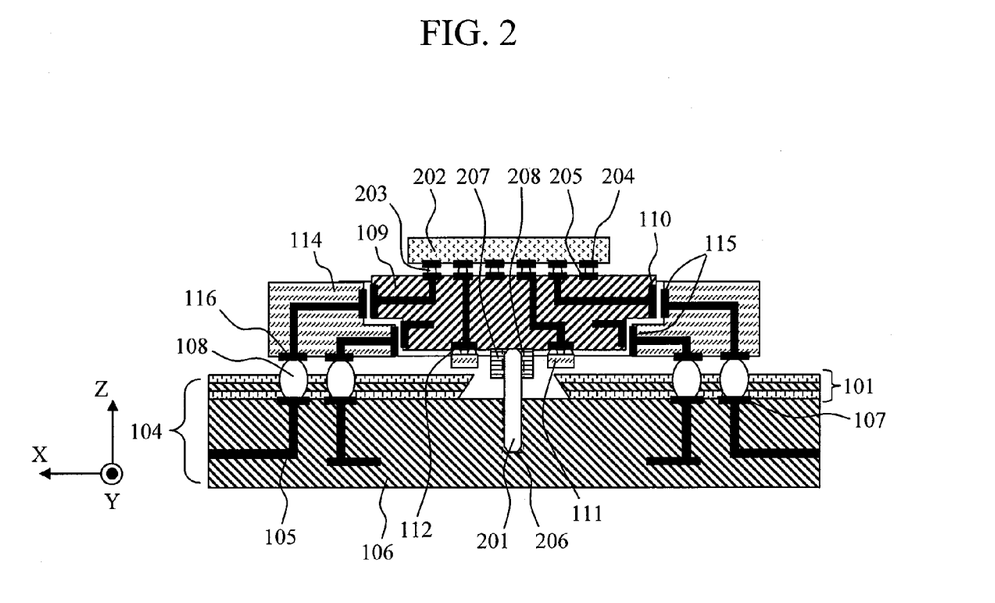
FIG. 2 is a sectional view showing a structure of the second embodiment of the present invention.

FIG. 2 is a sectional view showing a mounting example of the opto-electric package 109 and the opto-electric hybrid board 104 according to embodiment 2 of the present invention.

The opto-electric package 109 and the opto-electric hybrid board 104 are equipped with a mating mechanism for guide pins 201. The mating mechanism for the guide pins 201 provided on the opto-electric package 109 is members 207 in which mating holes 208 are opened. The mating mechanism for the guide pins 201 provided on the opto-electric hybrid board 104 is mating holes 206. The positioning of the optical signal input/output portions of the optical devices 111 and the optical waveguides 101 in the XY direction is determined by the guide pins 201. If sufficient positioning accuracy cannot be secured for the optical waveguides 101 and the printed board 106 in fabricating the optical waveguides 101 on the opto-electric hybrid board 104, a mechanism for mating with the guide pins 201 may be provided at portions of the optical waveguides 101 through which optical signals do not travel.

An electronic device 202 is mounted and electrodes 204 of the electronic device 202 are fixed on electrodes 205 on the opto-electric package 109 by means of solder bumps 203. On the other hand, the optical devices 111 are mounted on the lower surface of the opto-electric package 109. If the power input/output of optical signals is to be performed through the solder bumps 112, the optical devices 111 and the optical waveguides 101 may be allowed to be brought into close proximity until they contact one another under certain circumstances.

The side surfaces of the opto-electric package 109 shown in FIG. 2 have surfaces with heights varying in the X-axis direction, and the electrodes 110 are provided on each surface. The inner-wall side surfaces of the socket also have surfaces with heights varying in the X-axis direction, and the electrodes 115 are provided on each surface. Specifically, stair-like level differences are provided on the side surfaces of the opto-electric package, and the inner-wall side surfaces of the through-hole in the socket have shapes that follow those stair-like level differences. The opto-electric package inserted into the through-hole is supported by the stair-like surfaces. This structure will be an effective means for increasing the number of pads for the power inputted/outputted to/from the opto-electric package 109.

Embodiment 3

Figure 3:
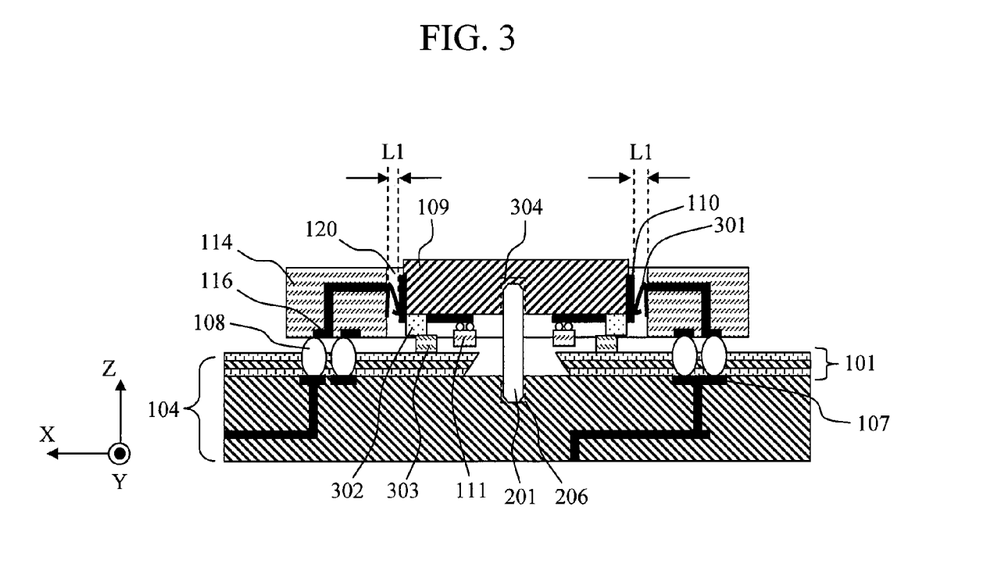
FIG. 3 is a sectional view showing a structure of the third embodiment of the present invention.

FIG. 3 is a sectional view showing a mounting example of the opto-electric package 109 and the opto-electric hybrid board 104 according to embodiment 3 of the present invention.

Mating holes 304 as a mating mechanism for the guide pins 201 are provided on the opto-electric package 109. In addition, the positioning of the opto-electric package 109 and the optical waveguides 101 in the Z direction is determined by means of a pedestal 302 and a pedestal 303.

Resilient electrodes 301 are provided on hole inner-walls 120 of the socket 114. There is a gap of L1 or thereabout between the hole inner-walls 120 of the socket 114 and the opto-electric package 109. However, L1 as shown in FIG. 3 is a gap that may be covered by the resilience of the resilient electrodes 301, where L1 is ordinarily on the order of several tens of microns to several millimeters. In other words, even if there are fabrication errors in the socket 114 and the opto-electric package 109, it is possible to achieve conduction between the resilient electrodes 301 and the electrodes 110.

The effects offered by the present embodiment by combining the guide pins 201 and the resilient electrodes 301 are significant. In general, positional offsets occur in the mounting positions of the optical devices 111 and the positions of the electrodes 110. When the positional accuracy of the optical devices 111 and the optical waveguides 101 is improved by means of the guide pins 201, a space is created between the electrodes 115 provided on the hole inner-walls 120 and the electrodes 110 provided on the opto-electric package 109, thereby disabling conduction. However, by attaching the resilient electrodes 301 to the electrodes 115, or by using the resilient electrodes 301 in place of the electrodes 115, it is possible to achieve conduction.

Figure 4A:
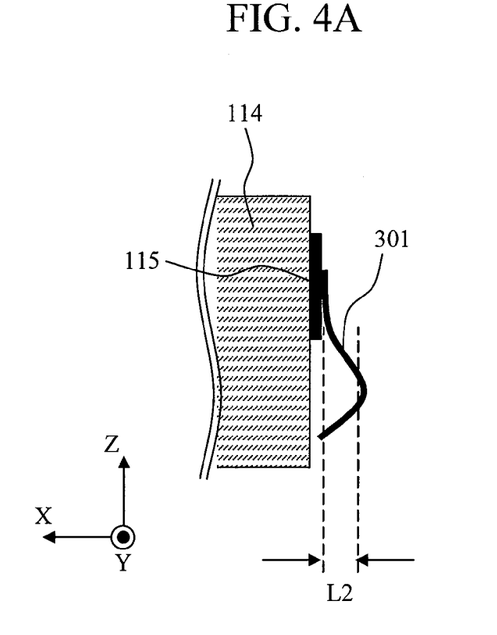
FIGS. 4A and 4B are sectional views showing the periphery of an electrode of the structure of the third embodiment of the present invention.
Figure 4B:
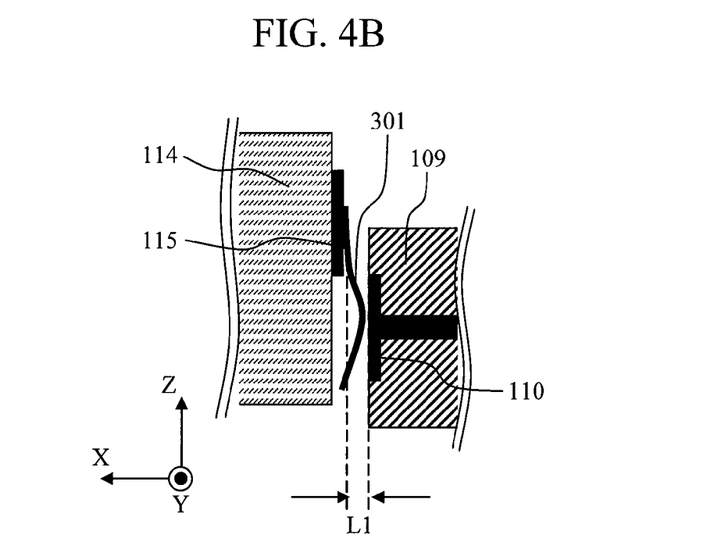

FIGS. 4A and 4B are diagrams that indicate another form of embodiment 3 of the present invention and that show the resilient electrode 301 and the periphery of the electrode 110. FIG. 4A is a diagram before the opto-electric package is inserted in the hole inner-walls 120 of the socket 114, and FIG. 4B is a diagram after the opto-electric package has been inserted in the hole inner-walls 120 of the socket 114. If L1<L2 holds true, it is possible to achieve conduction between the resilient electrodes 301 and the electrodes 110, where distance L2 is ordinarily on the order of several tens of microns to several millimeters. However, making L1 too small would destroy the resilient electrodes 301.

Embodiment 4

Figure 5A:
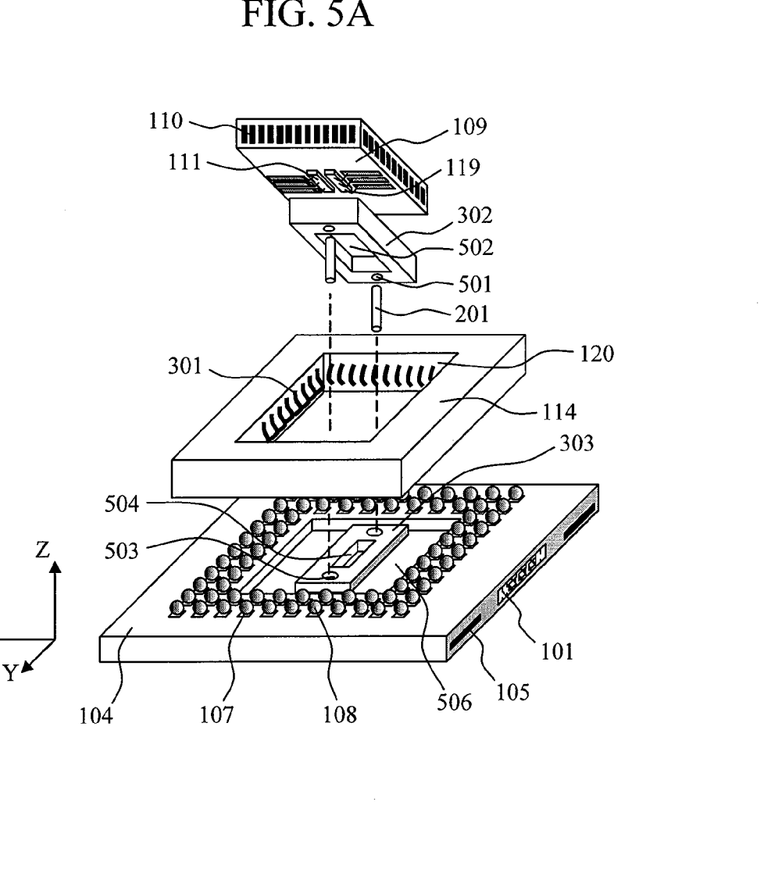
FIG. 5A is a perspective view and FIG. 5B is a sectional view.
Figure 5B:
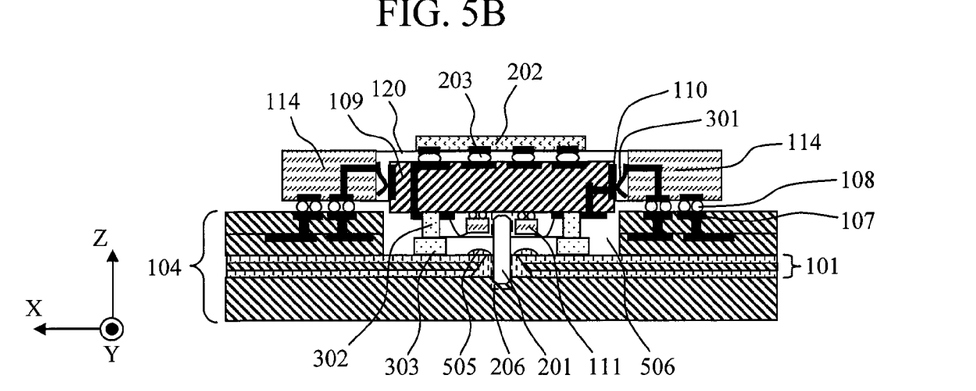

A form of embodiment 4 of the present invention is shown in FIGS. 5A and 5B. FIG. 5A shows a perspective view, and FIG. 5B shows a sectional view along the XZ plane.

Part of the optical waveguides 101 is located at the inner layer of the opto-electric hybrid board 104. When viewed from the positive direction of the Z-axis, at least the portion where optical signals are inputted/outputted is an optical waveguide exposing portion 506. Such an opto-electric hybrid board 104 has the advantage that the space in which the electrical transmission lines and the electrodes 107 of the upper layer may be disposed becomes greater. The socket 114 is bonded by means of the solder bumps 108 disposed on the electrodes 107.

The distance between the optical devices 111 and the optical waveguides 101 in the Z-axis direction is determined by the pedestal 302 and the pedestal 303. The pedestal 302 has an elongate hole 502, and the pedestal 303 has an elongate hole 504. Thus, the periphery of the channel between the optical devices 111 and the optical waveguides 101 through which optical signals travel is enclosed by the pedestal 302 and the pedestal 303, thereby making it possible to prevent dust, dirt, and the like from entering the optical path from the air outside. It is noted that the elongate hole 502 and the elongate hole 504 may also be configured in part or in whole with translucent members.

The pedestal 302 and the pedestal 303 comprise mating holes 501 and 503 for the guide pins 201. Lens elements 505 are mounted on the optical input/output portions of the optical waveguides 101. Thus, the optical coupling efficiency between the optical devices 111 and the optical waveguides 101 is improved.

Embodiment 5

Figure 6A:
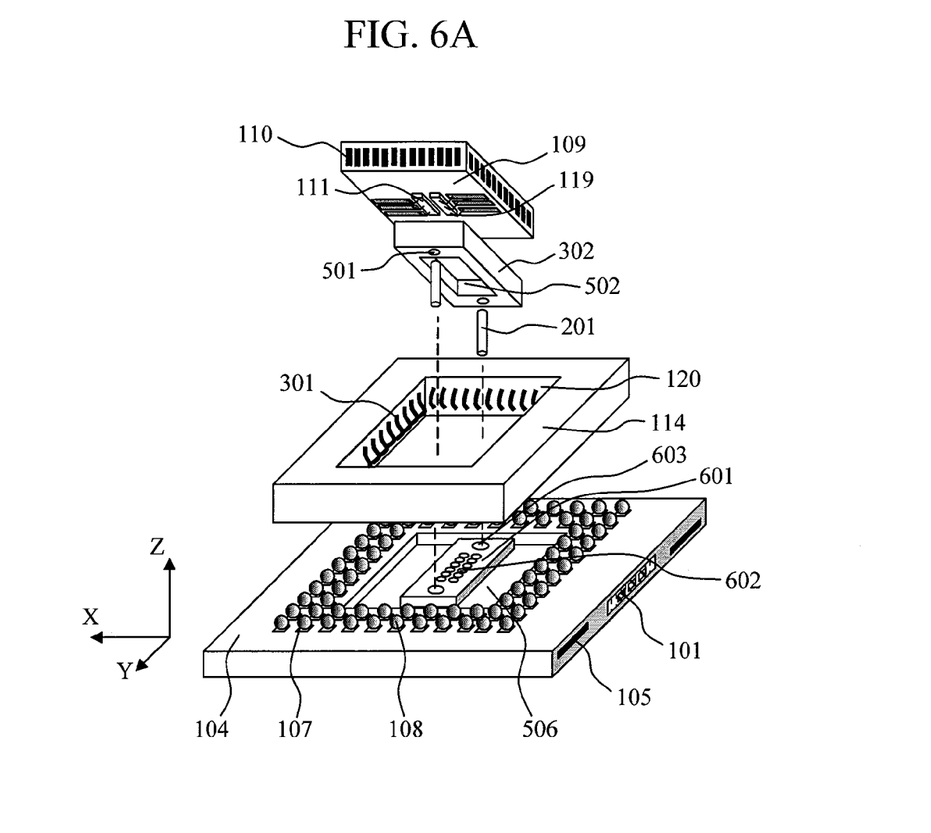
FIG. 6A is a perspective view and FIG. 6B is a sectional view.
Figure 6B:
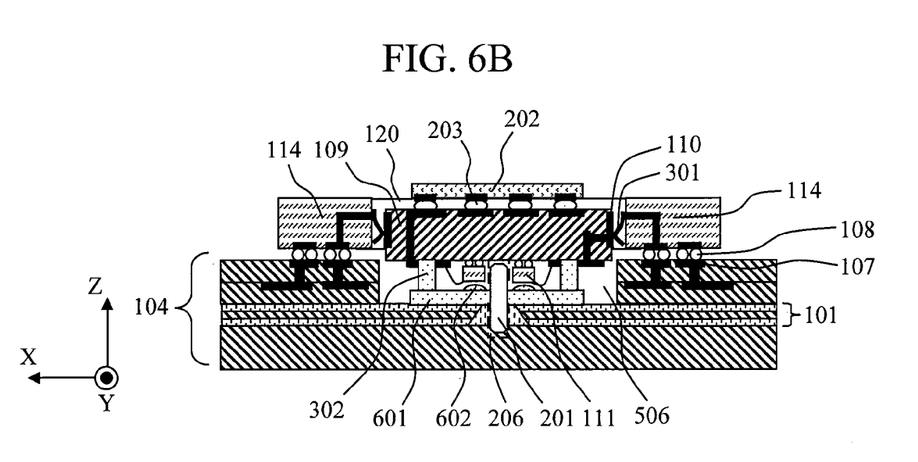

A perspective view of embodiment 5 of the present invention is shown in FIG. 6A, and a sectional view thereof is shown in FIG. 6B.

A lens member 601 on which lens elements 602 are formed is mounted on the optical waveguides 101 of the optical waveguide exposing portion 506. Thus, the optical coupling efficiency between the optical waveguides 101 and the optical devices 111 is improved. Mating holes 603 are provided in the lens member 601, and it is possible to perform optical positioning by means of the guide pins 201.

The elongate hole 502 is provided in the pedestal 302 that determines the distance between the lens member 601 and the optical devices 111 in the Z-axis direction. In other words, the optical devices 111 are positioned in a space enclosed by the opto-electric package 109, the elongate hole 502, and the lens member 601. Thus, dust, dirt, and the like entering this space from outside are reduced, and it becomes possible to maintain high optical coupling efficiency over an extended period. It is noted that part of the elongate hole 502 may also be configured with a translucent member.

Embodiment 6

Figure 7A:
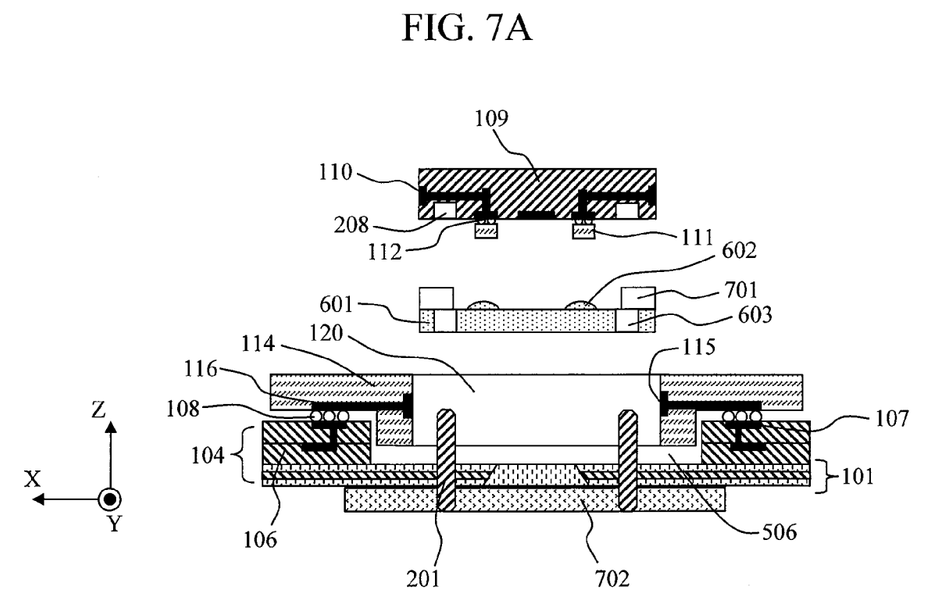
FIG. 7A is a sectional view and FIG. 7B is a perspective view of a lens member.
Figure 7B:
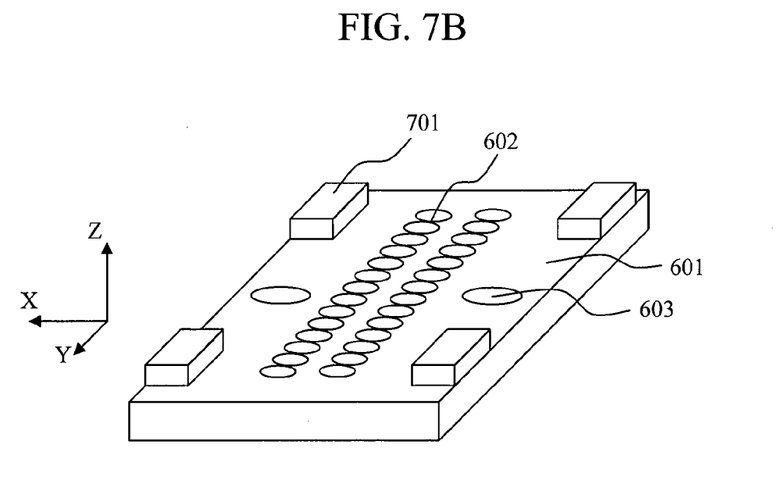

A form of embodiment 6 of the present invention is shown in FIGS. 7A and 7B, where FIG. 7A is a sectional view along the XZ plane, and FIG. 7B is a perspective view representing the lens member that was used.

The optical waveguides 101 are located at the lower layer of the opto-electric hybrid board 104. Thus, the inner layer and the upper layer of the printed board 106 may be used almost entirely as spaces for electrical wiring. The optical waveguide exposing portion 506 is provided in the periphery of the optical signal input/output portion.

The lens member 601 equipped with the lens elements 602 is mounted on the optical waveguide substrate. Pedestals 701 determine the distance between the lens member 601 and the opto-electric package 109 in the Z-axis direction. It is noted that the pedestals 701 may be integral with or separate from the lens member 601. The mating holes 603 provided in the lens member 601 are for mating with the guide pins 201.

The lens member 601 and the opto-electric package 109 are to be mounted over the optical waveguides 101. Since organic materials such as polymers and the like are often used as a material for the optical waveguides 101, bending, which often becomes a cause for optical propagation loss, occurs readily. As such, a reinforcement plate 702 is attached from the negative direction of the Z-axis of the optical waveguides 101. The guide pins 201 may also be mated with this reinforcement plate 702.

Embodiment 7

Figure 8:
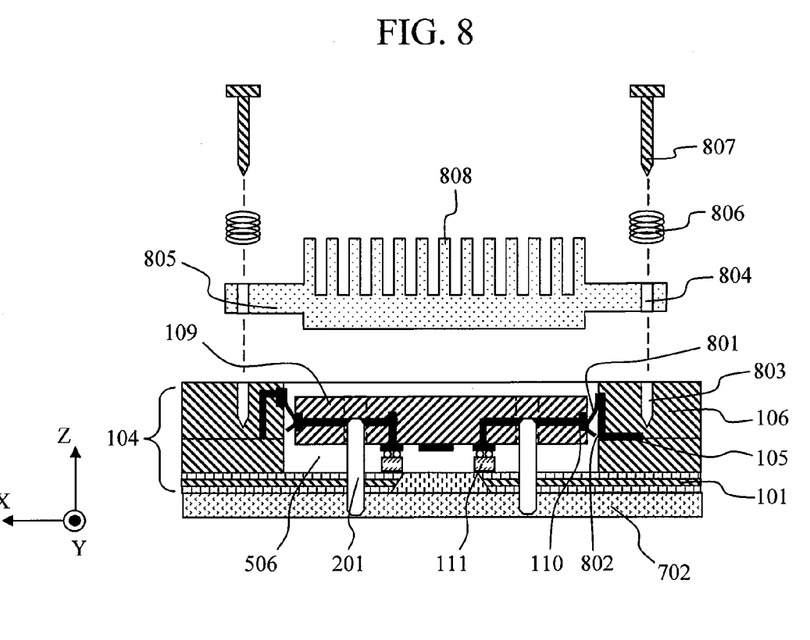
FIG. 8 is a sectional view showing a structure of the seventh embodiment of the present invention.

FIG. 8 is a sectional view showing embodiment 7 of the present invention. The optical waveguides 101 are provided at the lower layer of the opto-electric hybrid board 104. Electrodes 802 or resilient electrodes 801, which are electrically connected with electrical wiring 105, are attached to the inner walls of the optical waveguide exposing portion 506. In other words, it can be seen that, even without such members as the socket 114 and the like, power input/output to/from the opto-electric package 109 and the opto-electric hybrid board 104 is possible.

By attaching a heat dissipating member 805 with fins 808 onto the opto-electric hybrid board 104 using screws 807 inserted in circular holes 804 and screw holes 803, the opto-electric package 109 is fixed in the Z-axis direction. Further, by bringing the heat dissipating member 805 into contact with the opto-electric package 109, not only is heat dissipated from the opto-electric package 109, but also pressure is evenly applied to the opto-electric package 109 by the heat dissipating member 805. It is noted that by including springs 806, the heat dissipating member 805 is consequently elastically pressed against the opto-electric package, thereby making it easier to manage the pressing force. Thus, there is an advantage which is that, even if there are variations in the sizes of the members of the opto-electric package 109 and the opto-electric hybrid board 104, the heat dissipating member 805 becomes able to constantly apply an elastic force to the opto-electric package.

Embodiment 8

Figure 9:
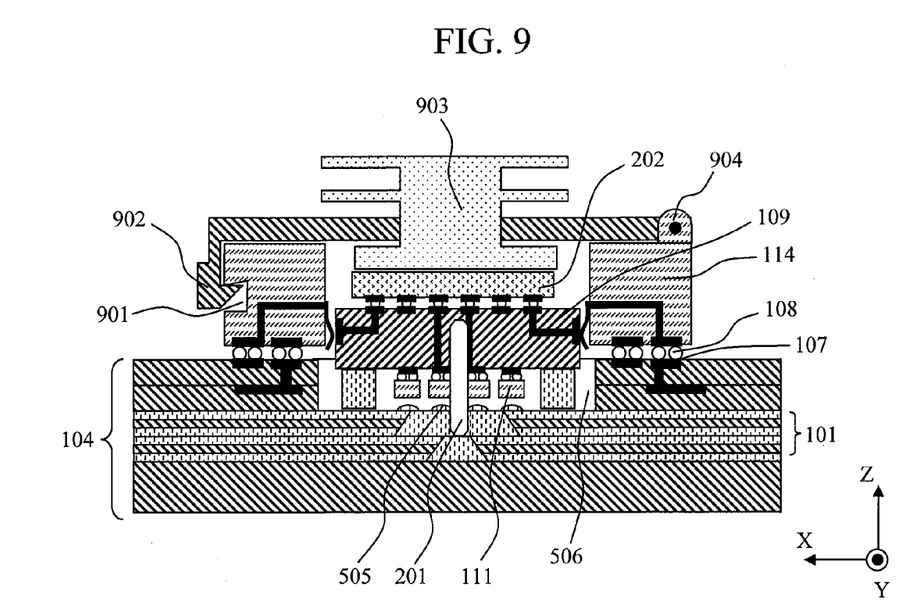
FIG. 9 is a sectional view showing a structure of the eighth embodiment of the present invention.

FIG. 9 is a sectional view showing embodiment 8 of the present invention. The optical waveguides 101 are provided at the inner layer of the opto-electric hybrid board. The optical waveguides 101 are two-layer optical waveguides. A pressing body 902 is fixed to the socket 114 at a pressing body fixing portion 904. The pressing body fixing portion 904 is the point of load of the pressing body 902. In fixing the opto-electric package 109 by means of the pressing body 902, part of the pressing body 902 should be mated with a groove 901. In other words, it is possible to press and fix the opto-electric package 109 without using any special tools. A heat dissipating member 903 is fixed to the pressing body 902, and the heat dissipating member 903 is in contact with the electronic device 202. It is noted that the heat dissipating method is not necessarily limited to fins, and may include forced cooling using fans, water cooling, heat pipes, Peltier devices, and the like.

Embodiment 9

Figure 10:
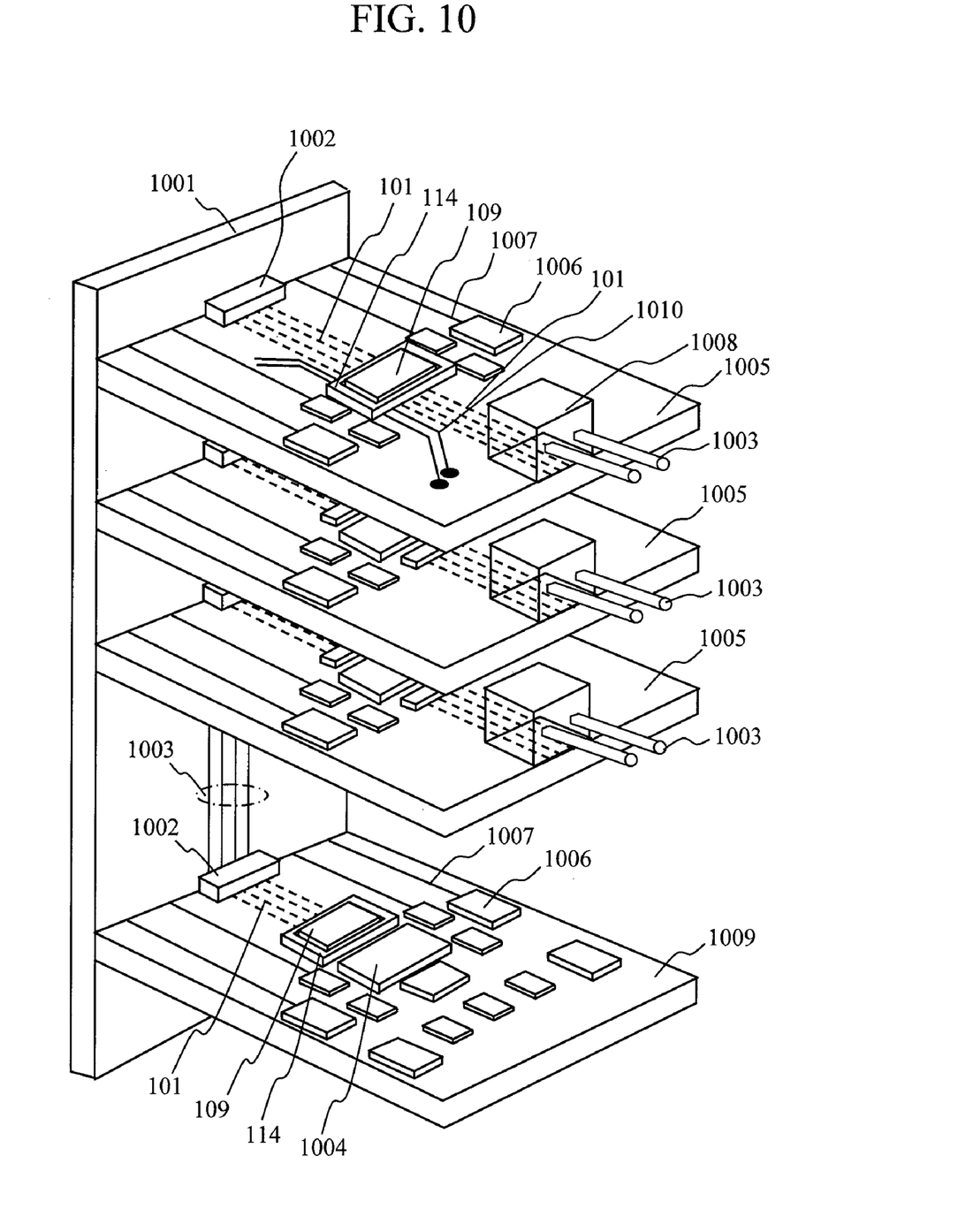
FIG. 10 is a perspective view of a device showing the ninth embodiment of the present invention.

FIG. 10 is a diagram showing the ninth embodiment relating to a device in which an opto-electric hybrid board and opto-electric package utilizing the present invention are applied. FIG. 10 is a diagram showing the interior of a transmission device or a high-speed information processing device, such as a router, a server, a switch, or the like, which uses a technique of the present invention. A plurality of cards 1005 and a plurality of switch cards 1009 are fixed to a daughterboard 1001 by means of opto-electric connectors 1002. Not only electrical wiring, but also the optical waveguides 101 are formed on the daughterboard 1001, the cards 1005, and the switch cards 1009 to form opto-electric hybrid boards. The optical waveguides 101 and electrical wiring 1007 are formed on the cards 1005, and the opto-electric packages 109 are mounted at the optical input/output portions of the optical waveguides 101. In addition, the packages 109 are inserted and fixed in the sockets 114. The sockets 114 are electrically connected with part of electrical wiring 1010. In addition, electronic devices 1006 are LSIs, ICs, electronic components, and the like. The daughterboard 1001 is wired with optical fibers 1003.

Optical connectors 1008 equipped with the optical fibers 1003 are used when optical signals are inputted to the cards 1005 from outside, or when optical signals are outputted to the outside of the cards 1005. Specifically, optical signals that are inputted to the device by means of the optical fibers 1003 travel through the optical waveguides 101, are inputted to the opto-electric packages 109, and are opto-electrically converted. Subsequently, electronic signals that have been processed at the electronic devices 1006 and the like are further electro-optically converted at the opto-electric packages 109, travel through the waveguides 101, the opto-electric connectors 1002, the optical fibers 1003, and the like, and are again opto-electrically converted at the opto-electric packages 109 on the switch cards 1009. A portion of the electrical signals is transmitted to a different card 1005 again as optical signals by means of switching electronic devices 1004 and the opto-electric packages 109. Naturally, various electronic devices may also be directly mounted on the opto-electric packages 109, and it is possible to let the opto-electric packages 109 have part of the functions of the switching electronic devices and the electronic devices 1006.

EXPLANATION OF REFERENCE NUMERALS 101 optical waveguide
102 cladding portion
103 core portion
104 opto-electric hybrid board
105 electrical wiring
106 printed board
107 electrode
108 solder bump
109 opto-electric package
110 electrode
111 optical device
112 solder bump
113 pedestal
114 socket
115 electrode
116 electrode
117 minor portion
118 notch portion
119 wire
120 hole inner-wall
201 guide pin
202 electronic device
203 solder bump
204 electrode
205 electrode
206 mating hole
207 member
208 mating hole
301 resilient electrode
302 pedestal
303 pedestal
304 mating hole
501 mating hole
502 elongate hole
503 mating hole
504 elongate hole
505 lens element
506 optical waveguide exposing portion
601 lens member
602 lens element
603 mating hole
701 pedestal
702 reinforcement plate
801 resilient electrode
802 electrode
803 screw hole
804 circular hole
805 heat dissipating member
806 spring
807 screw
808 fin
901 groove
902 pressing body
903 heat dissipating member
904 pressing body fixing portion
1001 daughterboard
1002 opto-electric connector
1003 optical fiber
1004 switching electronic device
1005 card
1006 electronic device
1007 electrical wiring
1008 optical connector
1009 switch card
1010 electrical wiring

What is claimed is:
1. A structure comprising:
an opto-electric hybrid board which has an optical waveguide that transmits an optical signal and an electrical transmission line that supplies power;

an opto-electric package, which optically and electrically couples with the opto-electric hybrid board, where the opto-electric package and the opto-electric hybrid board are optically coupled between a lower surface of the opto-electric package and an upper surface of the opto-electric hybrid board, and the opto-electric package comprises a first electrode disposed on a side surface thereof;

a first member including a second electrode that comes into contact with the first electrode, on an inner-wall side surface of the first member that faces the side surface of the opto-electric package, and the second electrode is connected to the electrical transmission line of the opto-electric hybrid board;

a lens element inserted into an optical signal optical axis along which optical coupling is achieved; and a lens member that holds the lens element, wherein a mechanism that mates with a guide pin is provided on the lens member.

2. The structure according to claim 1, wherein a stair-like level difference is formed on the side surface of the opto-electric package, and the inner-wall side surface of the first member comprises a shape that follows the stair-like level difference.

3. The structure according to claim 1, wherein the first electrode or the second electrode is a resilient conductor.

4. The structure according to claim 1, wherein at least one second member is disposed on the optical waveguide and/or on the lower surface of the opto-electric package, and the distance between the optical waveguide and the opto-electric package is determined by the second member.

5. The structure according to claim 4, wherein the second member is provided with a mechanism that mates with a guide pin.

6. The structure according to claim 4, wherein the second member is a plate-like body comprising a through-hole or a translucent member in its center portion, and the optical coupling between the opto-electric package and the opto-electric hybrid board is achieved via the through-hole or the translucent member.

7. The structure according to claim 1, wherein the optical waveguide is provided on the upper surface of the opto-electric hybrid board so as not to overlap at least a position of part of an electric pad.

* * * * *